United States Patent [19]
Vorenkamp et al.

[11] Patent Number: 5,742,248
[45] Date of Patent: Apr. 21, 1998

[54] DIFFERENTIAL AMPLIFIER WITH SIGNAL-DEPENDENT OFFSET, AND MULTI-STEP DUAL-RESIDUE ANALOG-TO-DIGITAL CONVERTER INCLUDING SUCH A DIFFERENTIAL AMPLIFIER

[75] Inventors: Pieter Vorenkamp; Johannes P. M. Verdaasdonk, both of Eindhoven, Netherlands

[73] Assignee: U.S. Philips Corporation, New York, N.Y.

[21] Appl. No.: 616,083

[22] Filed: Mar. 21, 1996

[30] Foreign Application Priority Data

Mar. 24, 1995 [EP] European Pat. Off. ............... 95200744

[51] Int. Cl.$^6$ ................................................ H03M 1/14
[52] U.S. Cl. ...................................... 341/156; 330/252
[58] Field of Search ................................ 341/156, 159, 341/155, 157, 158, 139; 330/252, 260, 292

[56] References Cited

U.S. PATENT DOCUMENTS

| | | |
|---|---|---|
| 4,267,516 | 5/1981 | Traa ........................... 330/149 |
| 5,184,130 | 2/1993 | Mangelsdorf .................. 341/156 |
| 5,353,027 | 10/1994 | Vorenkamp et al. ............ 341/156 |
| 5,525,930 | 6/1996 | Pothast et al. ................ 330/252 |

FOREIGN PATENT DOCUMENTS

| | | | |
|---|---|---|---|
| 0414389A1 | 2/1991 | European Pat. Off. | ......... H03M 1/36 |
| 0637128A1 | 2/1995 | European Pat. Off. | ......... H03F 1/32 |

*Primary Examiner*—Brian K. Young

[57] ABSTRACT

A differential amplifier comprises two input transistors and two cross-coupled transistors arranged in a translinear loop. A difference voltage across a resistance connected between the emitters of the cross-coupled transistors is equal to a difference voltage across the input terminals plus the sum of the offset voltages across resistors arranged in series with the respective emitters of the input transistors. The difference current through the cross-coupled transistors is replicated in output transistors, thereby producing an output signal amplitude larger than the input signal amplitude across a resistance coupled between the emitters of the output transistors. The differential amplifier is suitable, inter alia, as an interpolating residue signal amplifier with additional underflow and overflow ranges in multi-step dual-residue analog-to-digital converters.

11 Claims, 7 Drawing Sheets

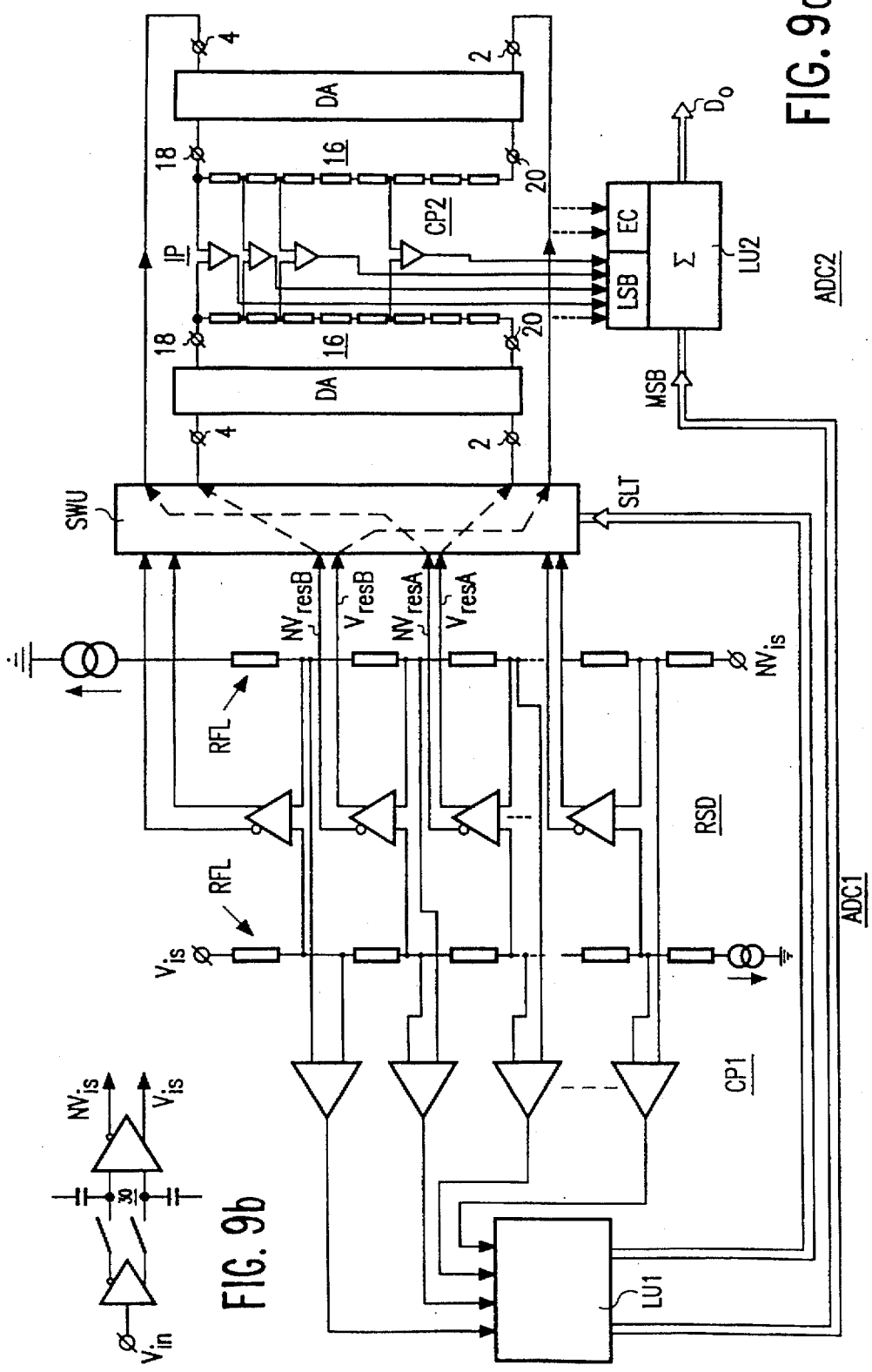

DIFFERENTIAL AMPLIFIER WITH SIGNAL-DEPENDENT OFFSET, AND MULTI-STEP DUAL-RESIDUE ANALOG-TO-DIGITAL CONVERTER INCLUDING SUCH A DIFFERENTIAL AMPLIFIER

BACKGROUND OF THE INVENTION

1. Field of the Invention

The invention relates to a differential amplifier comprising: a first and a second input terminal for receiving an input voltage; a first, a second, a third, a fourth, a fifth and a sixth transistor, each having a control electrode, a first main electrode and a second main electrode, the first transistor having its control electrode coupled to the first input terminal, and the second transistor having its control electrode coupled to the second input terminal, the first transistor having its first main electrode, the fourth transistor having its control electrode and the third transistor having its second main electrode coupled to a first node, the second transistor having its first main electrode, the third transistor having its control electrode and the fourth transistor having its second main electrode coupled to a second node, and the fifth transistor having its control electrode coupled to the first node and the sixth transistor having its control electrode coupled to the second node;

a first resistor connected between the first main electrode of the third transistor and the first main electrode of the fourth transistor;

a second resistor connected between the first main electrode of the fifth transistor and the first main electrode of the sixth transistor.

The invention also relates to a multi-step dual-residue analog-to-digital converter (ADC) including such a differential amplifier.

2. Description of the Related Art

Such a differential amplifier is known from European Patent Application EP 0 637 128 and has the special feature that a difference signal on the first and the second input terminal appears substantially undistorted across the first and the second resistor string. This special feature makes this known differential amplifier suitable for use in multi-step dual-residue ADCs. In multi-step ADCs a desired N-bit digital output signal is built up in two or more steps, in each of which steps an ADC converts an ever smaller subrange of the overall range of the analog input signal. In the frequently used two-step ADC a first ADC effects a coarse conversion to a first digital signal with M-bit resolution. A digital-to-analog converter (DAC) reconverts the first digital signal to a second analog signal. A second ADC subsequently converts the difference between or the residue of the analog input signal and the second analog signal to a second digital signal with (N-M)-bit resolution. The M bits of the first and the N-M bits of the second digital output signal are combined to provide the desired N-bit digital output signal, the bits of the first digital signal forming the most significant bits and the bits of the second digital signal forming the least significant bits of the desired digital output signal. Often an error correction is applied during combination in order to provide a correction for errors occurring in the system, for example decision errors in the first ADC. A multi-step ADC with error correction is known, for example, from United States Patent U.S. Pat. No. 5,353,027. The reference levels of the first ADC should have an accurately equal spacing, the DAC should have a satisfactory accuracy and, if amplification of the residue signal is applied, this should also be constant and accurate. If this is not the case, this will give rise to non-monotonicity in the multi-step ADC.

The dual-residue multi-step ADC largely precludes these problems. In a single-residue ADC the signal spacing (residue) of the analog input signal with respect to the (nearest) reference level is measured and is converted to a digital code. In a dual-residue multi-step ADC a second spacing (second residue) is measured, i.e. with respect to the nearest but one reference level.

FIG. 1 is a graphical representation of the dual-residue system. The input signal Vin is compared with the two nearest reference levels, in this case $V_1$ and $V_2$, of the reference ladder of the first ADC. The first ADC determines which two reference levels are eligible for this in response to a comparison of the analog input signal and the reference levels. The difference between the input voltage $V_{in}$ and the reference level $V_1$ is the first residue signal $V_{resA}$ and the difference between the input voltage $V_{in}$ and the reference level $V_2$ is the second residue signal $V_{resB}$. If the analog input voltage increases from $V_1$ to $V_2$ the first residue signal will increase from zero to a maximum equal to the spacing $V_2-V_1$ between the two reference levels. This is illustrated in FIG. 2, which also shows the inverse signal $NV_{resA}$. At the same time, the second residue signal $V_{resB}$ decreases from the same maximum to zero. The sum of the residue signals $V_{resA}$ and $V_{resB}$ represents the difference between the two nearest reference levels. The second ADC now measures the relative position of the analog input signal within the signal range determined by the two residue signals and converts this relative position to the second digital signal with the least significant bits. The relative position can be measured with respect to one of the two extremums of the signal range, i.e. from the bottom with respect to $V_1$ or from the top with respect to $V_2$, or with respect to the center of the signal range. The advantage of the dual-residue concept is that the signal range of the free conversion tracks possible fluctuations in the spacing between the reference levels of the coarse conversion. Indeed, the absolute value of the signal range is irrelevant for the relative position within the signal range.

Examples of such two-step dual-residue ADCs can be found in United States Patent U.S. Pat. No. 5,184,130 and in European Patent Application EP 0 414 389. These examples inter alia show that for determining the relative position use is made of one or more resistor strings in order to divide the signal range spanned by the residue signals into smaller subranges for the purpose of free quantization in the second ADC. The reference levels for fine conversion are obtained by interpolation of the two residue signals, which should be available with the correct polarity for this purpose. In said EP 0 414 389 the residue signals are available as differential signals and two interpolation circuits have been provided.

FIG. 3 shows the principle of interpolation of differential dual residue signals. The residue signals as shown in FIG. 4 are available between the tapping points of the resistor strings. The zero crossings between the reference levels $V_1$ and $V_2$ represent the reference levels for the fine conversion.

FIG. 5 shows a prior art bipolar transistor implementation of the interpolator, the configuration in FIG. 3 requiring two of these interpolators. This implementation corresponds to the differential amplifier in accordance with European Patent Application EP 0 637 128 mentioned in the introductory part and, if desired, it may also be realized with unipolar (MOS) transistors. If the resistance value of the resistor strings is the same, the voltage difference across the resistor string between the emitters of the transistors T5 and T6 is exactly $V_{resA}-NV_{resB}$. However, by means of this known differential amplifier interpolation is possible only between the signal range between the two residue signals. No overflow and overflow ranges can be generated for the purpose of error correction in the fine conversion.

FIG. 6 shows the circuit diagram of an interpolator in accordance with the invention having additional signal ranges at both ends of the original signal range of the two residue signals. FIG. 7 shows the associated interpolated signals. The additional range is created by arranging the offset generators in series with the buffers and providing the resistor strings with additional tapping points. In order to obtain an underflow range UR and an overflow range OR which are each equal to half the in-range IR between the two successive reference levels $V_n$ and $V_{n+1}$, the offset $V_{off}$ of the offset generators should be selected to equal half the difference between the two successive reference levels. Moreover, the number of tapping points should be doubled in order to enable a similar fine quantization to be achieved likewise in the overflow and the underflow range. The problem is now that the desired offset $V_{off}$ should not have a fixed value but a value correlated with the fluctuating signal range determined by the two residue signals.

SUMMARY OF THE INVENTION

It is an object of the invention to provide a differential amplifier with input signal dependent offset, which is suitable for use inter alia as an interpolator with underflow and overflow signal ranges in a multi-step dual-residue ADC.

To this end, according to the invention, the differential amplifier of the type defined in the opening paragraph is characterized in that the differential amplifier further comprises: a first series resistor connected between the first main electrode of the first transistor and the first node and a second series resistor connected between the first main electrode of the second transistor and the second node. By means of the series resistors it is achieved that across the second resistor string between the fifth and the sixth transistor a difference signal is obtained which is a given factor larger than the difference signal at the first and the second input terminal of the differential amplifier. The factor is determined by the ratio between the resistance value of the first and the second resistor string and by the ratio between the resistance value of the second resistor string and the sum of the resistance values of the first and the second series resistor.

In order to obtain an underflow range UR and an overflow range OR which are each equal to half the in-range IR between the two successive reference levels $V_n$ and $V_{n+1}$, the offset $V_{off}$ of the offset generators should be selected to equal half the difference between the two successive reference levels, an embodiment of a differential amplifier in accordance with the invention is characterized in that the first resistor and the second resistor have a substantially equal resistance value, and the first series resistor and the second series resistor have a substantially equal resistance value, which resistance value corresponds to a quarter of the resistance value of the first or the second resistor.

Another embodiment of the differential amplifier in accordance with the invention is characterized in that the differential amplifier further comprises: a seventh and an eighth transistor, each having a control electrode, a first main electrode and a second main electrode, the seventh transistor having its control electrode coupled to the control electrode of the first transistor, the eighth transistor having its control electrode coupled to the control electrode of the second transistor, the seventh transistor having its first main electrode coupled to the second main electrode of the fifth transistor, and the eighth transistor having its first main electrode coupled to the second main electrode of the sixth transistor.

The signal currents flowing through the seventh and the eighth transistor are in phase opposition to the signal currents through the first and the second transistor, respectively. As a result, the control signals of the first and the seventh transistor are in antiphase and cancel one another, thereby causing the input impedance at the first input terminal to increase. With the second and the eighth transistor a similar effect is obtained at the second input terminal.

The differential amplifier in accordance with the invention can be used for various purposes, the desired input signal dependent offset being obtained by a suitable choice of the series resistors. It is apparent from the foregoing that the differential amplifier is particularly suitable for use in a multi-step dual-residue analog-to-digital converter for converting an analog input signal to a digital output signal, comprising:

a first analog-to-digital converter, arranged to receive the analog input signal and comprising first reference means for generating reference levels of different magnitude, and comparison means for comparing the analog input signal with the reference levels and for supplying a first digital signal with at least one most significant bit of the digital output signal in response to the comparison;

residue means for generating a first and a second residue signal, which residue signals indicate the differences between the value of the analog input signal and two of the reference levels of the first reference means;

a second analog-to-digital converter for supplying a second digital signal with at least one bit of less significance than said bit of the first digital signal in response to the first and the second residue signal and comprising an interpolator for supplying second reference levels in response to the first and the second residue signal by interpolation of the first and the second residue signal, characterized in that the interpolator comprises a differential amplifier as defined hereinbefore, the first and the second input terminal being arranged to receive the first and second residue signals.

BRIEF DESCRIPTION OF THE DRAWINGS

These and other aspects of the invention will be apparent from and will be elucidated with reference to the accompanying drawings, in which

FIG. 9 shows an embodiment of a multi-step dual-residue analog-to-digital converter in accordance with the invention.

In these Figures parts or items having the same function or purpose bear the same reference symbols.

DESCRIPTION OF THE PREFERRED EMBODIMENTS

Figure 8:
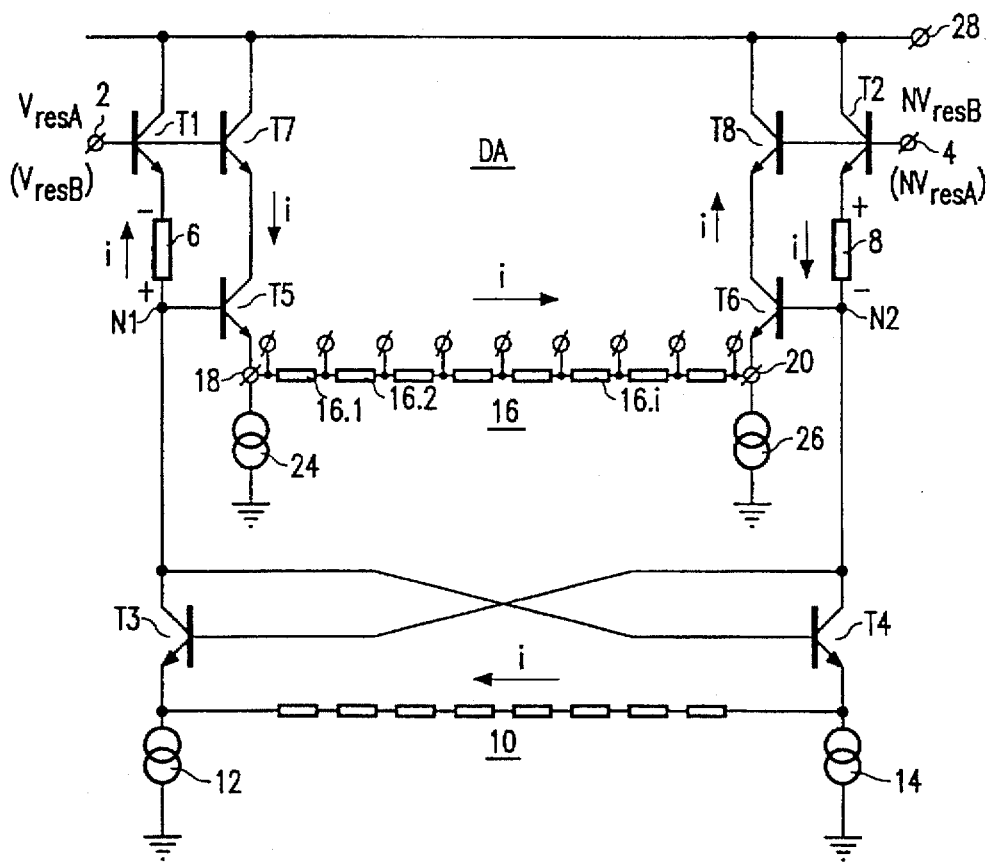
FIG. 8 shows a differential amplifier in accordance with the invention for use in, inter alia, the interpolation circuit shown in FIG. 6.

FIG. 8 shows a differential amplifier DA in accordance with the invention, comprising bipolar transistors whose control electrode, first main electrode and second main electrode correspond to the base, the emitter and the collector, respectively. However, if desired, it is likewise possible to use unipolar transistors, in which case the control electrode, the first main electrode and the second main electrode correspond to the gate, the source and the drain, respectively.

The base of a first transistor T1 is connected to a first input terminal 2 and the base of a second transistor T2 is connected to a second input terminal 4. The emitter of the transistor T1 is connected to a first node N1 via a first series resistor 6 and the emitter of the transistor T2 is connected to a second node N2 via a second series resistor 8. The collector of a third transistor T3, the base of a fourth transistor T4 and the base of a fifth transistor T5 are connected to the first node N1. The collector of a fourth transistor T4, the base of the third transistor T3 and the base of a sixth transistor T6 are connected to the second node N2. A first resistor string 10 is connected between the emitters of the transistors T3 and T4. It is to be noted that, if desired, the first resistor string 10 may comprise a smaller number of resistors or a single resistor. A current source 12 and a current source 14 are coupled to the emitters of the transistors T3 and T4 to supply emitter current to the transistors T3 and T4. A second resistor string 16 is connected between the emitters of the transistors T5 and T6 to output terminals 18 and 20. If desired, the second resistor string 16 may comprise a smaller number of resistors or a single resistor. A current source 24 and a current source 26 are coupled to the emitters of the transistors T5 and T6 to supply emitter current to the transistors T5 and T6. Instead of two current sources 12 and 14 it is possible, if desired, to connect a single current source to the center of the first resistor string 10. Moreover, instead of two current sources 24 and 26 it is possible, if desired, to connect a single current source to the center of the second resistor string 16.

Figure 5:
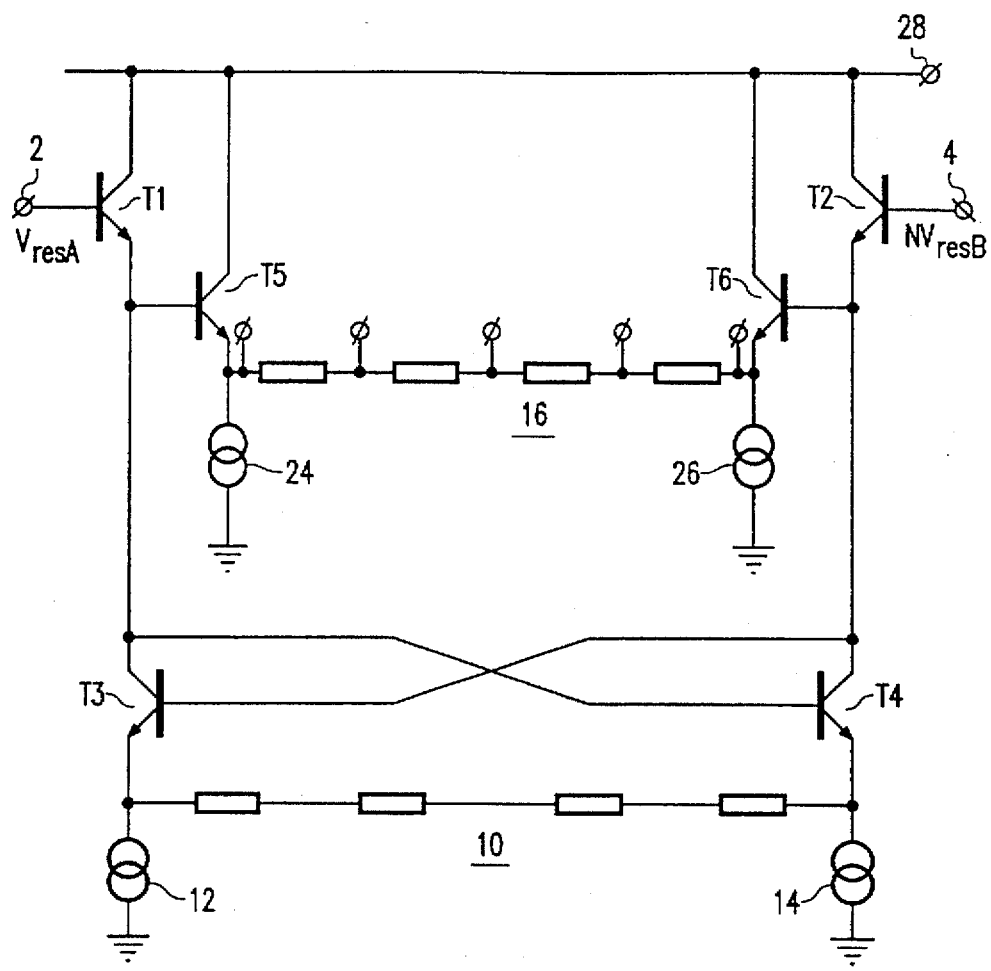
FIG. 5 shows a known differential amplifier for use in, inter alia, the interpolation circuit shown in FIG. 3.

The collector of the transistor T5 can be connected in various manners. It may be connected directly to a positive supply terminal 28, as is shown in FIG. 5; via a load resistor (not shown); or via a cascode transistor T7 having its emitter, base and collector connected to the collector of the transistor T5, the base of the transistor T1, and the positive supply terminal 28, respectively.

The collector of the transistor T6 may be connected similarly to the collector of the transistor T5. It may be connected directly to a positive supply terminal 28, as is shown in FIG. 5; via a load resistor (not shown); or via a cascode transistor T8 having its emitter, base and collector connected to the collector of the transistor T6, the base of the transistor T2, and the positive supply terminal 28, respectively.

In order to preclude saturation of the transistors T3 and T4 in the case of large drive signals the bases of the transistors T3 and T4 may be connected, if desired, to the second node N2 and the first node N1, respectively, via respective offset sources. The offset sources may be implemented as emitter followers having their bases connected to the respective node N2 or N1 and having their emitters connected to the base of the respective transistor T3 or T4.

Hereinafter, it has been assumed for the time being that the series resistors 6 and 8 have been short-circuited. In that case the sum of the voltage V2 on the input terminal 2, the base-emitter voltage VBET1 of the transistor T1, the base-emitter voltage VBET4 of the transistor T4 and the voltage V10a across the right-hand half of the resistor string 10 is equal to the sum of the voltage V4 on the input terminal 4, the base-emitter voltage VBET2 of the transistor T2, the base-emitter voltage VBET3 of the transistor T3 and the voltage V10b across the left-hand half of the resistor string 10:

$$V2+VBET1+VBET4+V10a = V4+VBET2+VBET3+V10b \qquad (1)$$

In the case of identical transistors T1 and T3 VBET1=VBET3 because the currents through the transistors T1 and T3 are equal. The same applies to the transistors T2 and T4, so that VBET2=VBET4. Equation (1) may then be reduced to:

$$V2-V4=V10b-V10a \qquad (2)$$

The voltage difference across the input terminals 2, 4 thus appears across the resistor string 10 and produces a difference current i which is independent of the base-emitter voltages and which is therefore very linear. The difference current i also flows through the transistors T1 and T2.

The transistors T5 and T4 receive a similar control signal at their bases. This is also the case with the transistors T6 and T3. By selecting the currents of the current sources 12, 14, 24 and 26, the resistance values of the resistor strings 10 and 16, and the dimensions of the transistors T3, T4, T5 and T6 to be equal to one another, it is now achieved that the difference current i through the transistors T5 and T6 is equal to and equally linear as but directed oppositely to the difference current through the transistors T1/T3 and T2/T4. The same effect, however, can also be obtained by scaling up the dimensions of the transistors T5 and T6 and the current of the current sources 24 and 26 and by scaling down the resistor string by the same factor.

Figure 6:
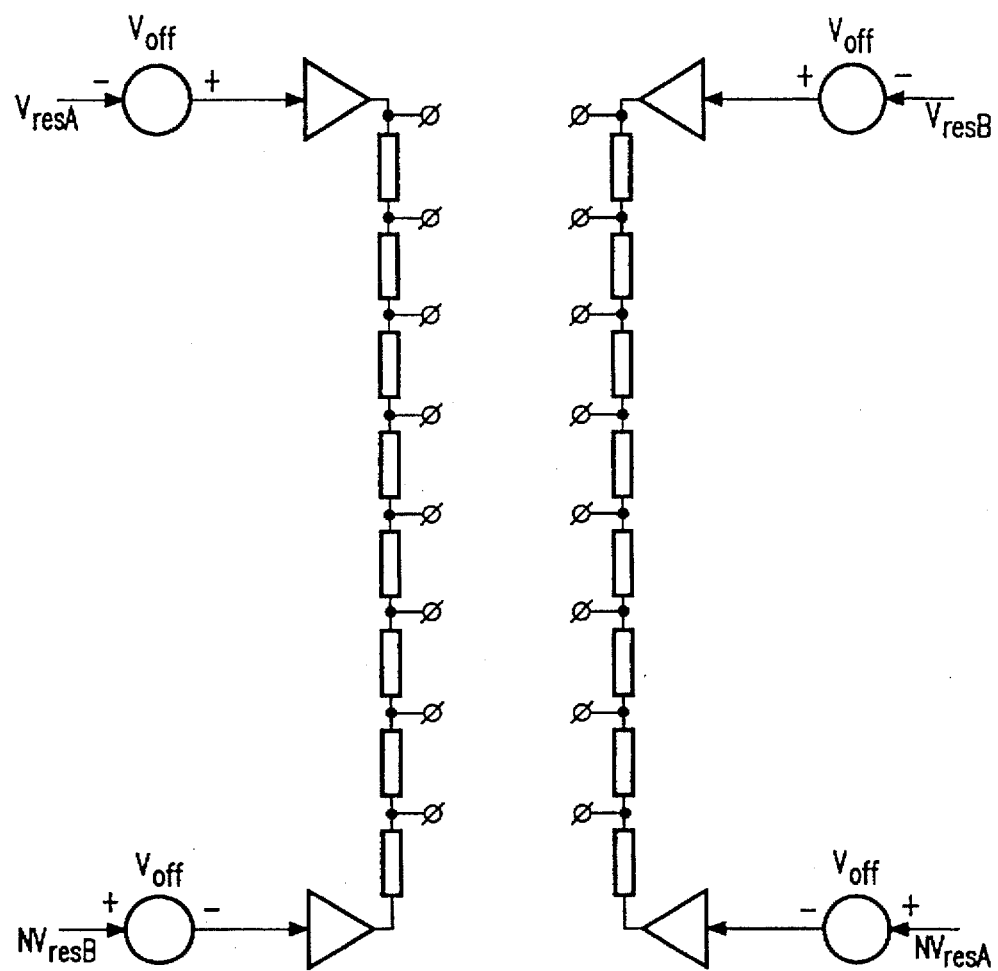
FIG. 6 is a block diagram of an interpolation circuit for use in a multi-step dual-residue analog-to-digital converter in accordance with the invention.

The introduction of the series resistors 6 and 8 results in an offset $-i*R/2$ being produced across the series resistor 6 between the emitter of the transistor T1 and the first node N1 and an opposite offset $+i*R/2$ being produced across the second series resistor 8 between the emitter of the transistor T2 and the second node N2. R/2 is the resistance value of the first and the second series resistor. The offsets are dependent on the signal current i, which is proportional to the signal voltage difference between the input terminals 2 and 4. The offsets may be assumed to be in series with the input terminals in a manner as shown in FIG. 6.

Figure 7:
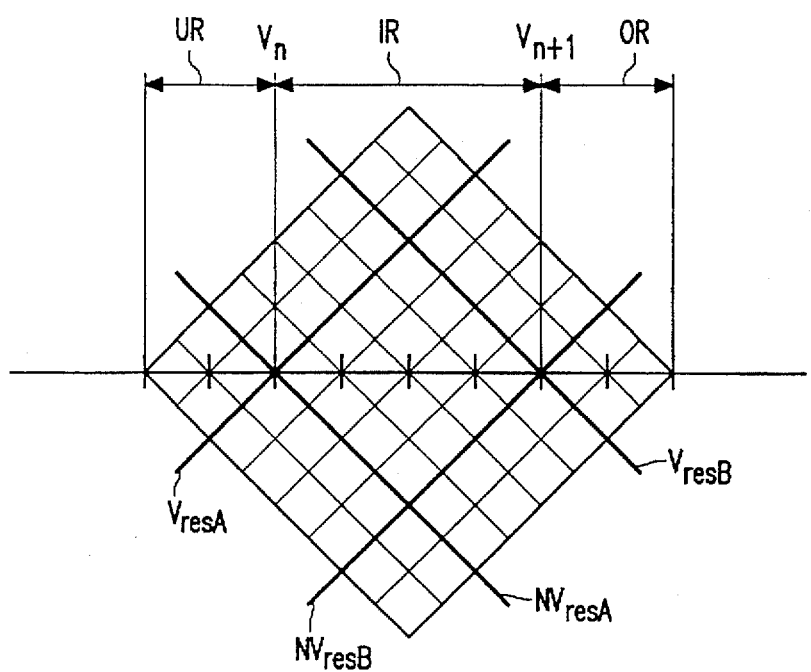
FIG. 7 illustrates the relationship between the residue signals and the interpolated signals in the interpolation circuit shown in FIG. 6.

This results in a voltage difference across the second resistor string 16, which voltage difference is equal to the voltage difference V2–V4 plus the sum $i*R$ of the offsets across the series resistors 6 and 8. By selecting the resistance value of the resistor string 16 to be equal to $2*R$, the difference voltage across the resistor string 16 now becomes equal to twice the voltage difference of the input signal V2–V4. If $V2=V_{resA}$ and $V4=NV_{resB}$ in a first differential amplifier and $V2=V_{resB}$ and $V4=NV_{resA}$ in a second differential amplifier the signals as shown in FIG. 7 are obtained. As a result of the inclusion of the series resistors 6 and 8 a differential signal amplitude is obtained across the output terminals 18 and 20 which is larger than the differential signal amplitude across the input terminals 2 and 4.

The signal currents i through the transistors T1 and T5 appear to be opposite to one another. The same applies to the signal currents through the transistors T2 and T6. This can be utilized in an advantageous manner by the use of the cascode transistors T7 and T8. The base current of the cascode transistor T7 is in phase opposition to the base current of the transistor T1. The base currents of the transistors T1 and T7 thus cancel one another, as a result of which the input impedance at the input terminal 2 increases. The degree of cancellation depends on the extent to which the amplitudes of the signal currents i through the transistors T5 and T1 are equal to one another. For this purpose, the resistance values of the resistor strings 16 and 10, or of the resistor string 16 and a single resistor 10, are selected to be equal to one another.

The differential amplifier may alternatively be equipped with PNP transistors or with unipolar (PMOS or NMOS) transistors.

Figure 1:
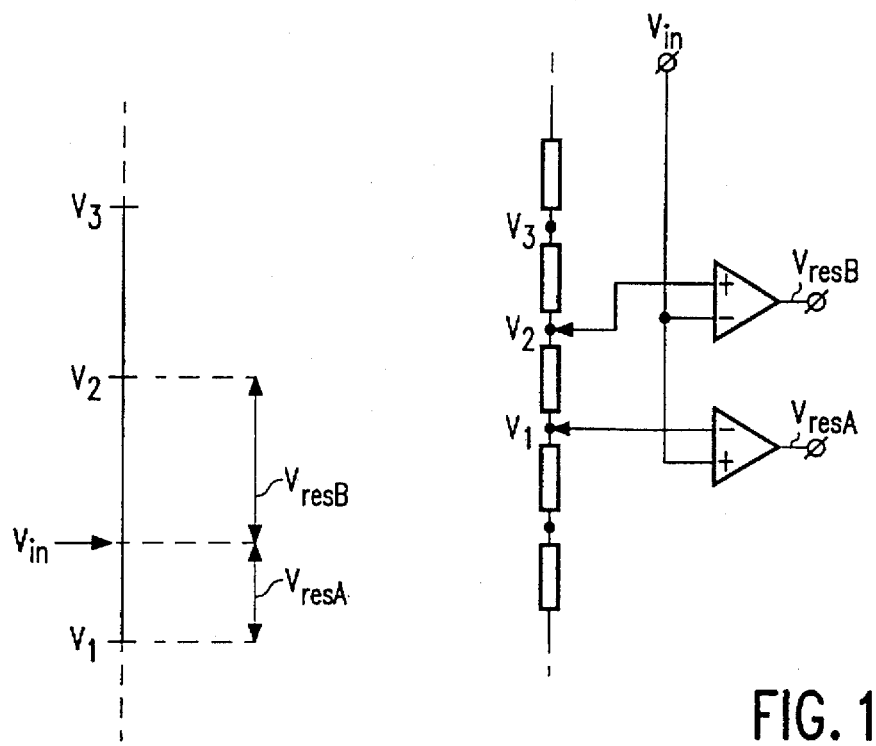
FIG. 1 is a representation to illustrate the operation of a multi-step dual-residue analog-to-digital converter.
Figure 2:
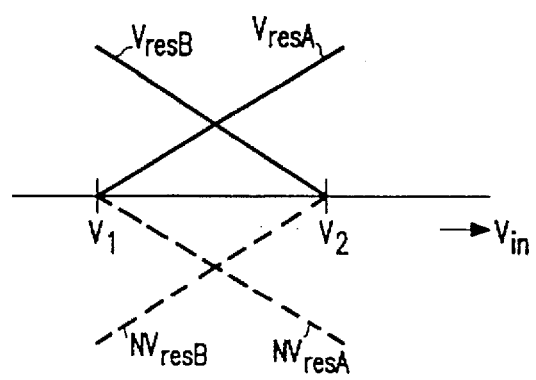
FIG. 2 shows signal waveforms of residue signals and inverse residue signals occurring in a multi-step dual-residue analog-to-digital converter.
Figure 3:
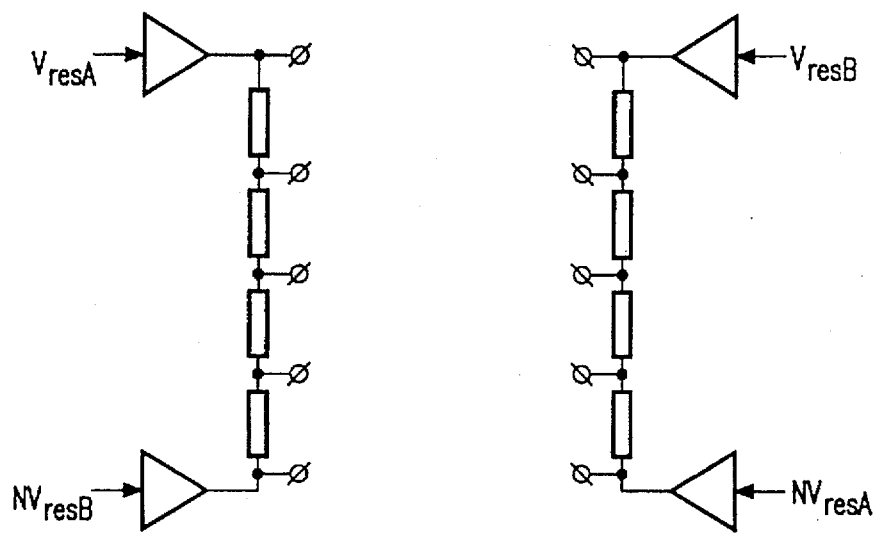
FIG. 3 is a block diagram of a known interpolation circuit for use in a multi-step dual-residue analog-to-digital converter.
Figure 4:
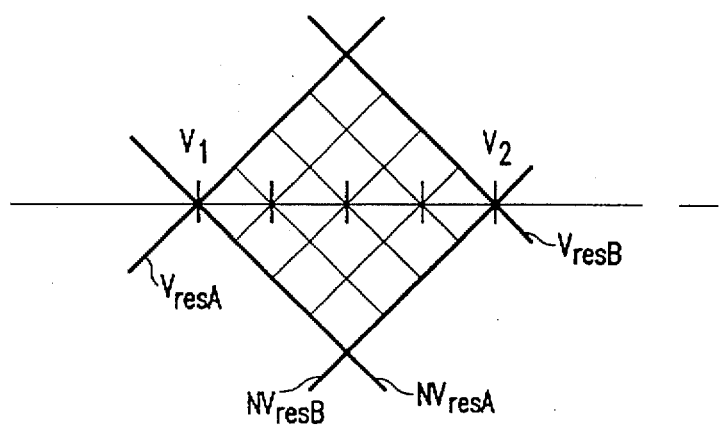
FIG. 4 illustrates the relationship between the residue signals and the interpolated signals in the interpolation circuit shown in FIG. 3.

FIG. 9 a shows a two-step dual-residue analog-to-digital converter (ADC) comprising two differential amplifiers in accordance with the invention, each referenced DA. As shown in FIG. 9b, in a sample-and-hold circuit 30 the analog input signal $V_{in}$ is sampled and buffered in a buffer having differential outputs for supplying a differential sampled signal $V_{is}/NV_{is}$ to a double reference ladder RFL. The tapping points of the two ladders are connected to the inputs of comparators, bearing the common reference CP1, whose output signals are applied to a first logic unit LU1. The sample-and-hold circuit 30, the double reference ladder RFL, the comparators CP1 and the first logic unit LU1 together form a first converter ADC1, which performs a coarse conversion of the analog signal $V_{in}$, resulting in a group of most significant bits MSB. Residue amplifiers, bearing the common reference RSD, have their differential inputs also connected to the tapping points of the ladders. The residue amplifiers RSD have differential outputs for supplying a differential residue signal. The differential residue signals of each time two successive residue amplifiers are used in a manner which may be described as the differential variant of the circuit arrangement shown in FIG. 1. The first logic unit LU1 determines on the basis of the coarse conversion which two successive residue amplifiers these are. For this purpose, the first logic unit applies a selection signal SLT to a switching unit SWU, which transfers the relevant differential residue signals to an interpolator Ip of the differential type. The selected residue signals are transferred to the inputs 2 and 4 of two differential amplifiers DA of the type described with reference to FIG. 8. The tapping points of respective second resistor strings 16 supply the interpolated residue signals for further quantization in the fine converter. Fine conversion is effected in a second converter ADC2 comprising comparators, of which only a few are shown and which bear the common reference CP2. The output signals of the comparators CP2 are connected to a second logic unit LU2, which translates these signals into a group of least significant bits LSB and error correction bits EC and combines the most significant bits MSB, if necessary after correction, and the least significant bits LSB to form a digital output signal $D_o$.

We claim:

1. A differential amplifier comprising: a first and a second input terminal for receiving an input voltage; a first, a second, a third, a fourth, a fifth and a sixth transistor, each having a control electrode, a first main electrode and a second main electrode, the first transistor having its control electrode coupled to the first input terminal and the second transistor having its control electrode coupled to the second input terminal, the first transistor having its first main electrode, the fourth transistor having its control electrode and the third transistor having its second main electrode coupled to a first node, the second transistor having its first main electrode, the third transistor having its control electrode and the fourth transistor having its second main electrode coupled to a second node, and the fifth transistor having its control electrode coupled to the first node and the sixth transistor having its control electrode coupled to the second node;

a first resistor connected between the first main electrode of the third transistor and the first main electrode of the fourth transistor;

a second resistor connected between the first main electrode of the fifth transistor and the first main electrode of the sixth transistor, wherein amplifier further comprises: a first series resistor is connected between the first main electrode of the first transistor and the first node and a second series resistor is connected between the first main electrode of the second transistor and the second node.

2. A differential amplifier as claimed in claim 1, which further comprises: a seventh and an eighth transistor, each having a control electrode, a first main electrode and a second main electrode, the seventh transistor having its control electrode coupled to the control electrode of the first transistor, the eighth transistor having its control electrode coupled to the control electrode of the second transistor, the seventh transistor having its first main electrode coupled to the second main electrode of the fifth transistor, and the eighth transistor having its first main electrode coupled to the second main electrode of the sixth transistor.

3. A differential amplifier as claimed in claim 1 wherein the first resistor and the second resistor have a substantially equal resistance value.

4. A differential amplifier as claimed in claim 3, wherein the second resistor comprises a plurality of series-connected resistance elements connected to one another in tapping points.

5. A differential amplifier as claimed in claim 4, wherein that the first series resistor and the second series resistor have a substantially equal resistance value, which resistance value corresponds to a quarter of the resistance value of the first or the second resistor.

6. A multi-step dual-residue analog-to-digital converter for converting an analog input signal ($V_{in}$) to a digital output signal ($D_o$), comprising:

a first analog-to-digital converter (ADC1), arranged to receive the analog input signal and comprising first reference means (RFL) for generating reference levels of different magnitude, and comparison means (CP1)

for comparing the analog input signal with the reference levels and for supplying a first digital signal (MSB) with at least one most significant bit of the digital output signal in response to the comparison;

residue means (RSD) for generating a first ($V_{resA}$/$NV_{resA}$) and a second ($V_{resB}$/$NV_{resB}$) residue signal, which residue signals indicate the differences between the value of the analog input signal and two of the reference levels of the first reference means (RFL);

a second analog-to-digital converter (ADC2) for supplying a second digital signal (LSB) with at least one bit of less significance than said bit of the first digital signal (MSB) in response to the first and the second residue signal and comprising an interpolator (IP) for supplying second reference levels in response to the first and the second residue signal by interpolation of the first and the second residue signal, wherein the interpolator (IP) comprises a differential amplifier as claimed in claims 1 wherein, the first (2) and the second (4) input terminal being to receive the first and second residue signals.

7. A multi-step dual-residue analog-to-digital converter for converting an analog input signal ($V_{in}$) to a digital output signal ($D_o$), comprising:

a first analog-to-digital converter (ADC1), arranged to receive the analog input signal and comprising first reference means (RFL) for generating reference levels of different magnitude, and comparison means (CP1) for comparing the analog input signal with the reference levels and for supplying a first digital signal (MSB) with at least one most significant bit of the digital output signal in response to the comparison;

residue means (RSD) for generating a first ($V_{resA}$/$NV_{resA}$) and a second ($V_{resB}$/$NV_{resB}$) residue signal, which residue signals indicate the differences between the value of the analog input signal and two of the reference levels of the first reference means (RFL);

a second analog-to-digital converter (ADC2) for supplying a second digital signal (LSB) with at least one bit of less significance than said bit of the first digital signal (MSB) in response to the first and the second residue signal and comprising an interpolator (IP) for supplying second reference levels in response to the first and the second residue signal by interpolation of the first and the second residue signal, wherein the interpolator (IP) comprises a differential amplifier as claimed in claim 3 wherein the first and the second input terminal receive the first and second residue signals.

8. A differential amplifier as claimed in claim 2 wherein the first resistor and the second resistor have a substantially equal resistance value.

9. A differential amplifier as claimed in claim 1, wherein the second resistor comprises a plurality of series-connected resistance elements connected to one another in tapping points.

10. A differential amplifier as claimed in claim 9, wherein the first series resistor and the second series resistor have a substantially equal resistance value, which resistance value corresponds to a quarter of the resistance value of the first or the second resistor.

11. A differential amplifier as claimed in claim 3, wherein the first series resistor and the second series resistor have a substantially equal resistance value, which resistance value corresponds to a quarter of the resistance value of the first or the second resistor.

* * * * *